United States Patent
Chien et al.

(10) Patent No.: US 9,627,426 B2
(45) Date of Patent: Apr. 18, 2017

(54) IMAGE SENSOR DEVICE AND METHOD FOR FORMING THE SAME

(71) Applicant: Taiwan Semiconductor Manufacturing Co., Ltd, Hsin-Chu (TW)

(72) Inventors: Volume Chien, Tainan (TW); Yu-Heng Cheng, Lukang Township (TW); Fu-Tsun Tsai, Tainan (TW); Hsi-Jung Wu, Kaohsiung (TW); Chi-Cherng Jeng, Tainan (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 14/192,168

(22) Filed: Feb. 27, 2014

(65) Prior Publication Data

US 2015/0243697 A1    Aug. 27, 2015

(51) Int. Cl.
*H01L 27/146*  (2006.01)

(52) U.S. Cl.
CPC .... *H01L 27/14629* (2013.01); *H01L 27/1463* (2013.01); *H01L 27/14685* (2013.01); *H01L 27/14621* (2013.01); *H01L 27/14627* (2013.01)

(58) Field of Classification Search
None
See application file for complete search history.

(56) References Cited

U.S. PATENT DOCUMENTS

| | | | |
|---|---|---|---|
| 5,611,941 A * | 3/1997 | Booth | 216/23 |
| 5,628,663 A * | 5/1997 | Potter | H01J 3/022 |
| | | | 445/49 |
| 7,315,014 B2 | 1/2008 | Lee et al. | |
| 7,477,440 B1 * | 1/2009 | Huang | 359/290 |
| 2005/0151228 A1 * | 7/2005 | Tanida | H01L 21/76843 |
| | | | 257/620 |
| 2006/0081890 A1 * | 4/2006 | Kang | 257/233 |
| 2010/0155868 A1 | 6/2010 | Jang | |
| 2011/0108939 A1 | 5/2011 | Marty et al. | |

(Continued)

FOREIGN PATENT DOCUMENTS

KR    10-0670606 B1    1/2007

OTHER PUBLICATIONS

Mou Pal et al., "Effects of crystallization and dopant concentration on the emission behavior of TiO2:Eu nanophosphors," 2012, Nanoscale Research Letters, 7:1, total pp. 12.*

(Continued)

*Primary Examiner* — Kimberly Rizkallah
*Assistant Examiner* — Bo Bin Jang
(74) *Attorney, Agent, or Firm* — Birch, Stewart, Kolasch & Birch, LLP (57) ABSTRACT

Embodiments of the disclosure provide an image sensor device. The image sensor device includes a semiconductor substrate. The semiconductor substrate has a front surface, a back surface opposite to the front surface, a light-sensing region close to the front surface, and a trench adjacent to the light-sensing region. The image sensor device includes a reflective layer positioned on an inner wall of the trench, wherein the reflective layer has a light reflectivity ranging from about 70% to about 100%.

20 Claims, 6 Drawing Sheets

(56) References Cited

U.S. PATENT DOCUMENTS

| | | |
|---|---|---|
| 2011/0156186 A1* | 6/2011 | Iida .................... H01L 27/1463 257/432 |
| 2011/0198732 A1* | 8/2011 | Lin et al. ...................... 257/621 |
| 2012/0217601 A1 | 8/2012 | Miyanami |
| 2013/0249039 A1 | 9/2013 | Hsu et al. |
| 2013/0323875 A1* | 12/2013 | Park ................ H01L 31/022408 438/70 |
| 2014/0077323 A1 | 3/2014 | Velichko et al. |
| 2014/0110809 A1 | 4/2014 | Kitamura et al. |
| 2014/0239361 A1 | 8/2014 | Ma |
| 2014/0353468 A1 | 12/2014 | Choi et al. |
| 2015/0077841 A1 | 3/2015 | Matsuo et al. |
| 2015/0155327 A1 | 6/2015 | Kuboi |

OTHER PUBLICATIONS

Jingmei Yuan et al., "Influence of purity of HfO2 on reflectance of ultraviolet multilayer," 2008, Chinese Optics Letters, 6(3), pp. 222-224.*

Lee et al., "Selective removal of CuIn1-xGaxSe2 absorber layer with no edge melting using a nanosecond Nd: YAG laser", Journal of Physics D: Applied Physics, IOP Publishing, 46 (Feb. 8, 2013) 105502 (10 Pages).

Wu et al., "Black silicon: A new light absorber for photovoltaic applications", OSA/CLEO, 1998, 2 pages.

* cited by examiner

IMAGE SENSOR DEVICE AND METHOD FOR FORMING THE SAME

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component that can be created using a fabrication process) has decreased. Such advances have increased the complexity of processing and manufacturing ICs. For these advances, similar developments in IC processing and manufacturing are needed.

Along with the advantages realized from reducing geometry size, improvements are being made directly to the IC devices. One such IC device is an image sensor device. An image sensor device includes a pixel array (or grid) for detecting light and recording intensity (brightness) of the detected light. The pixel array responds to the light by accumulating a charge. The higher the intensity of the light is, the more the charge is accumulated in the pixel array. The accumulated charge is then used (for example, by other circuitry) to provide image information for use in a suitable application, such as a digital camera.

However, since the feature sizes continue to decrease, fabrication processes continue to become more difficult to perform. Therefore, it is a challenge to form reliable image sensor devices with smaller and smaller sizes.

BRIEF DESCRIPTION OF THE DRAWINGS

Aspects of the present disclosure are best understood from the following detailed description when read with the accompanying FIGURES. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the FIGURES. The spatially relative terms are intended to encompass different orientations of the device in use or operation in addition to the orientation depicted in the FIGURES. The apparatus may be otherwise oriented (rotated 90 degrees or at other orientations) and the spatially relative descriptors used herein may likewise be interpreted accordingly. It is understood that additional operations can be provided before, during, and after the method, and some of the operations described can be replaced or eliminated for other embodiments of the method.

Figure 1A:
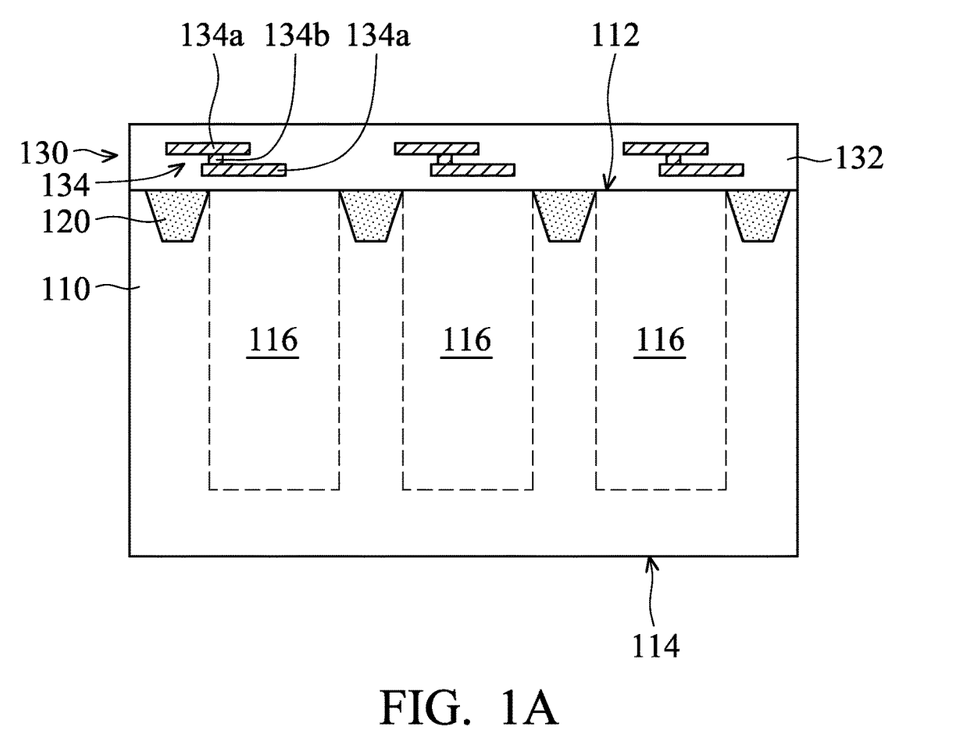
FIGS. 1A-1F are cross-sectional views of various stages of a process for forming an image sensor device, in accordance with some embodiments.

FIGS. 1A-1F are cross-sectional views of various stages of a process for forming an image sensor device 100, in accordance with some embodiments. As shown in FIG. 1A, a semiconductor substrate 110 is provided. The semiconductor substrate 110 has a front surface 112 and a back surface 114 opposite to the front surface 112.

The semiconductor substrate 110 may be a silicon substrate doped with a P-type dopant such as boron, in which case the semiconductor substrate 110 is a P-type substrate. Alternatively, the semiconductor substrate 110 could be another suitable semiconductor material. For example, the semiconductor substrate 110 may be a silicon substrate doped with an N-type dopant such as phosphorous or arsenic, in which case the substrate is an N-type substrate. The semiconductor substrate 110 may include other elementary semiconductor materials such as germanium.

In some embodiments, isolation structures 120 are formed in the semiconductor substrate 110 to define various light-sensing regions in the semiconductor substrate 110, and to electrically isolate neighboring devices (e.g. transistors) from one another. In some embodiments, the isolation features 120 are formed adjacent to or near the front surface 112.

In some embodiments, the isolation structures 120 are made of a dielectric material, such as silicon oxide, silicon nitride, silicon oxynitride, fluoride-doped silicate glass (FSG), a low-K dielectric material, other suitable materials, or combinations thereof. In some embodiments, the isolation structures 120 are formed by using an isolation technology, such as local oxidation of semiconductor (LOCOS), shallow trench isolation (STI), or the like.

In some embodiments, the formation of the isolation structures 120 includes patterning the semiconductor substrate 110 by a photolithography process, etching trenches in the semiconductor substrate 110 (for example, by using a dry etching, wet etching, plasma etching process, or a combination thereof), and filling the trenches (for example, by using a chemical vapor deposition process) with the dielectric material. In some embodiments, the filled trenches may have a multi-layer structure, such as a thermal oxide liner layer filled with silicon nitride or silicon oxide.

In some embodiments, the semiconductor substrate 110 is fabricated with front end processes, in accordance with some embodiments. For example, the semiconductor substrate 110 includes various regions, which may include a pixel region, a periphery region, a bonding pad region, and a scribe line region. For the sake of simplicity, only a portion of the pixel region is shown in FIGS. 1A-1F.

The pixel region includes pixels each with a light-sensing region 116 (also referred to as a radiation-sensing region). The light-sensing regions 116 of the pixels are doped with a doping polarity opposite from that of the semiconductor substrate 110. The light-sensing regions 116 are formed by one or more implantation processes or diffusion processes. The light-sensing regions 116 are formed close to (or adjacent to, or near) the front surface 112 of the semiconductor substrate 110. The light-sensing regions 116 are operable to sense incident light (or incident radiation) that enters the pixel region. The incident light may be visible light. Alternatively, the incident light may be infrared (IR), ultraviolet (UV), X-ray, microwave, other suitable types of light, or a combination thereof.

Although only a portion of the pixel region is shown in FIGS. 1A-1F, the pixel region may further include pinned layers, photodiode gates, reset transistors, source follower transistors, and transfer transistors. The transfer transistors are electrically connected with the light-sensing regions 116 to collect (or pick up) electrons generated by incident light (incident radiation) traveling into the light-sensing regions 116 and to convert the electrons into voltage signals, in accordance with some embodiments. For the sake of simplicity, detailed structures of the above features are not shown in FIGURES of the present disclosure.

In some embodiments, an interconnection structure 130 is formed over the front surface 112. The interconnection structure 130 includes a number of patterned dielectric layers and conductive layers that couple to various doped features, circuitry, photodiode gates, reset transistors, source follower transistors, and transfer transistors. For example, the interconnection structure 130 includes an interlayer dielectric (ILD) layer 132 and a multilayer interconnection (MLI) structure 134 in the ILD layer 132.

The MLI structure 134 includes conductive lines 134a and vias (or contacts) 134b connected between the conductive lines 134a. It should be understood that the conductive lines 134a and the vias 134b are merely exemplary. The actual positioning and configuration of the conductive lines 134a and the vias 134b may vary depending on design needs and manufacturing concerns.

Figure 1B:
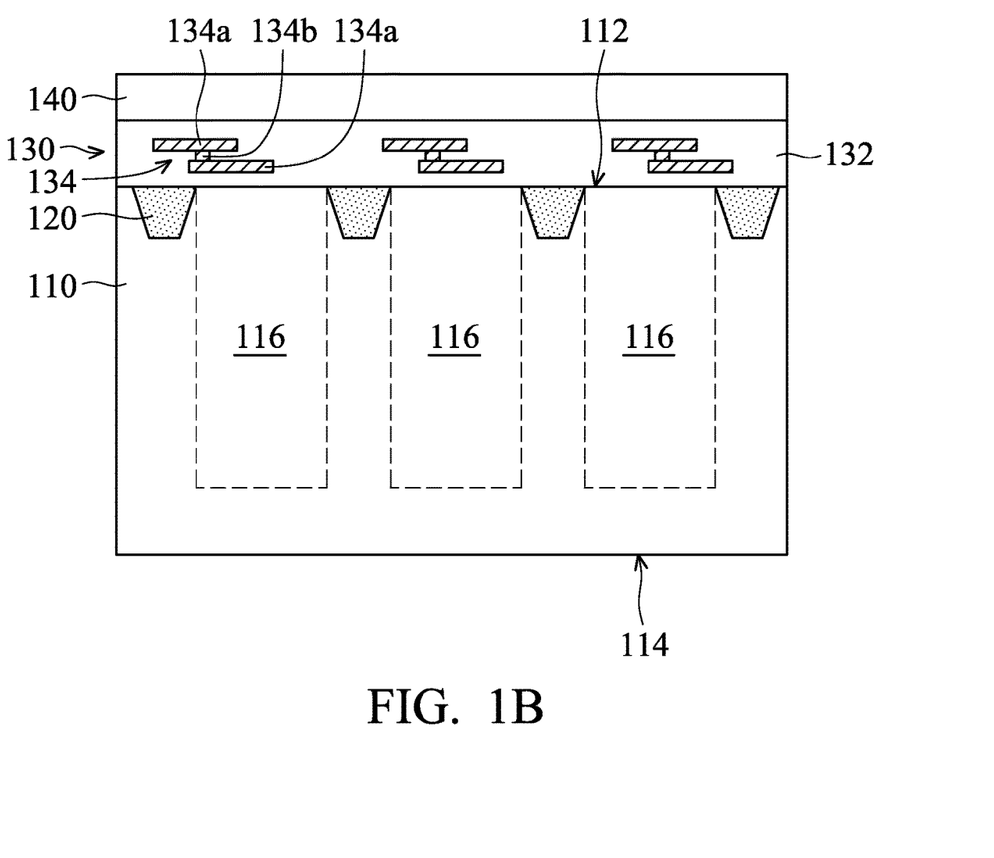
Figure 1C:
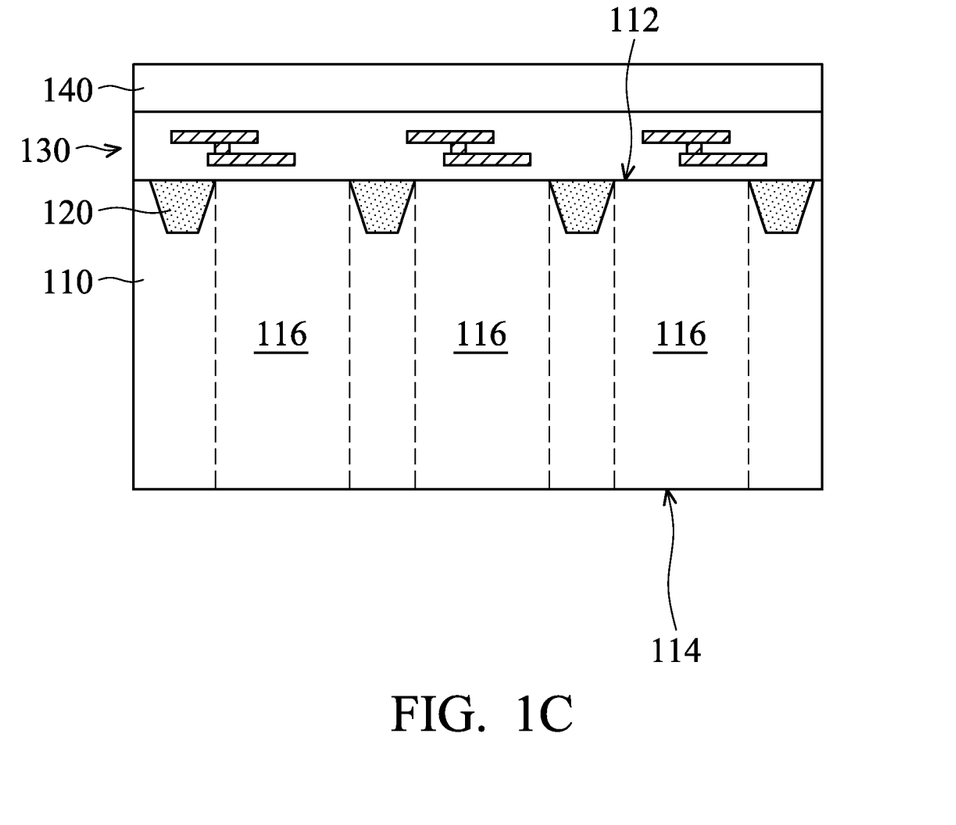

Afterwards, as shown in FIG. 1B, a carrier substrate 140 is bonded with the interconnection structure 130, in accordance with some embodiments. The carrier substrate 140 includes a silicon substrate, a glass substrate or another suitable substrate. Thereafter, as shown in FIGS. 1B and 1C, a thinning process is performed to thin the semiconductor substrate 110 from the back surface 114. The thinning process may include a chemical mechanical polishing process.

Figure 1D:
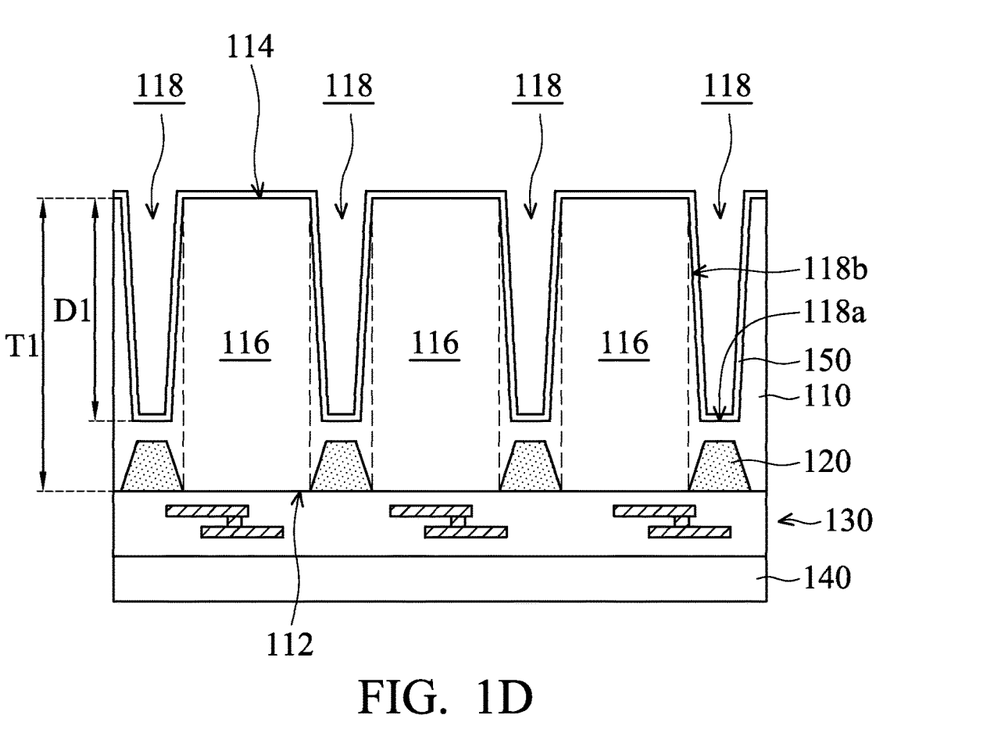

Afterwards, as shown in FIG. 1D, the semiconductor substrate 110 is flipped over, and trenches (also referred to as deep trenches) 118 are formed in the semiconductor substrate 110, in accordance with some embodiments. The trenches 118 extend from the back surface 114, in accordance with some embodiments. The trenches 118 are between the light-sensing regions 116, in accordance with some embodiments. In some embodiments, the trenches 118 are above the isolation structures 120. In some embodiments, a ratio of a depth D1 of the trenches 118 to a thickness T1 of the semiconductor substrate 110 ranges from about 20% to about 80%.

Afterwards, an insulating layer 150 (also referred to as a liner layer) is formed on the back surface 114 of the semiconductor substrate 110, bottom surfaces 118a and inner walls 118b of the trenches 118, in accordance with some embodiments. In some embodiments, the insulating layer 150 is configured to electrically isolate structures subsequently formed in the trenches 118 from the semiconductor substrate 110.

In some embodiments, the insulating layer 150 is also configured to passivate the back surface 114 of the semiconductor substrate 110, the bottom surfaces 118a and the inner walls 118b of the trenches 118. In some embodiments, the insulating layer 150 is further configured to electrically isolate the light-sensing regions 116 from one another to reduce electrical crosstalk between the light-sensing regions 116. The insulating layer 150 includes silicon oxides or other suitable insulating materials. The insulating layer 150 is formed by, for example, a thermal oxidation process.

Figure 1E:
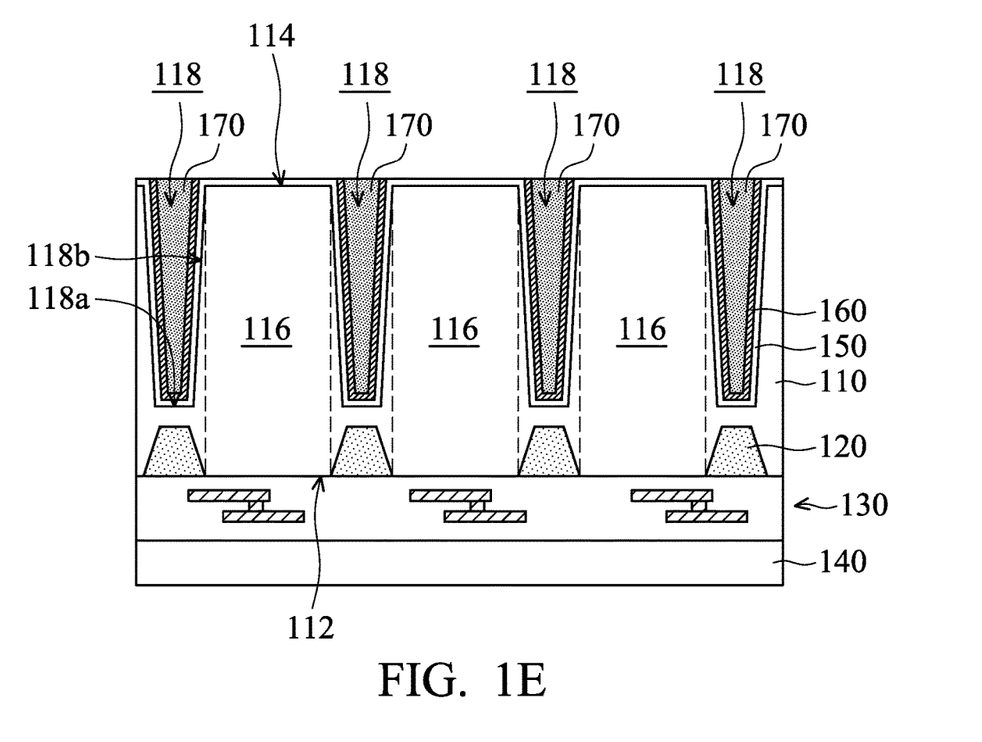

Thereafter, as shown in FIG. 1E, a reflective layer 160 is formed in the trenches 118. In some embodiments, the reflective layer 160 is formed on the bottom surfaces 118a and the inner walls 118b of the trenches 118. In some other embodiments, the reflective layer 160 is merely formed on the inner walls 118b of the trenches 118. The reflective layer 160 is conformally formed on the insulating layer 150, in accordance with some embodiments. The reflective layer 160 is positioned between the light-sensing regions 116, in accordance with some embodiments. The reflective layer 160 is configured to reflect incident light to prevent the incident light from traveling between different light-sensing regions 116, in accordance with some embodiments.

In some embodiments, the reflective layer 160 has a light reflectivity ranging from about 70% to about 100%. In some embodiments, the reflective layer 160 includes a metal material or an alloy material. The reflective layer 160 includes W, Al, Cu, Ti, alloys thereof, combinations thereof, or other suitable reflective materials. The reflective layer 160 has a thickness ranging from about 10 nm to about 30 nm, in accordance with some embodiments.

In some embodiments, the method of forming the reflective layer 160 includes conformally depositing a reflective material layer on the insulating layer 150; and removing the reflective material layer outside of the trenches 118. The method of depositing the reflective material layer includes performing a chemical vapor deposition (CVD) process, a physical vapor deposition (PVD) process, or another suitable process. The method of removing the reflective material layer outside of the trenches 118 includes performing a chemical mechanical polishing (CMP) process or another suitable process.

Thereafter, insulating structures 170 are filled in the trenches 118, in accordance with some embodiments. The insulating structures 170 are configured to fill and level up the trenches 118, in accordance with some embodiments. In each of the trenches 118, the reflective layer 160 is positioned between the insulating structure 170 and the insulating layer 150, in accordance with some embodiments. In each of the trenches 118, the reflective layer 160 surrounds the insulating structure 170, in accordance with some embodiments. The insulating structures 170 includes oxides (such as silicon oxides) or another suitable insulating material.

In some embodiments, the method of forming the insulating structures 170 includes depositing an insulating material layer on the semiconductor substrate 110 and filled in the trenches 118; and removing the insulating material layer outside of the trenches 118. The method of depositing the insulating material layer includes performing a chemical vapor deposition (CVD) process process, or another suitable process. The method of removing the insulating material layer outside of the trenches 118 includes performing a chemical mechanical polishing (CMP) process or another suitable process.

Figure 1F:
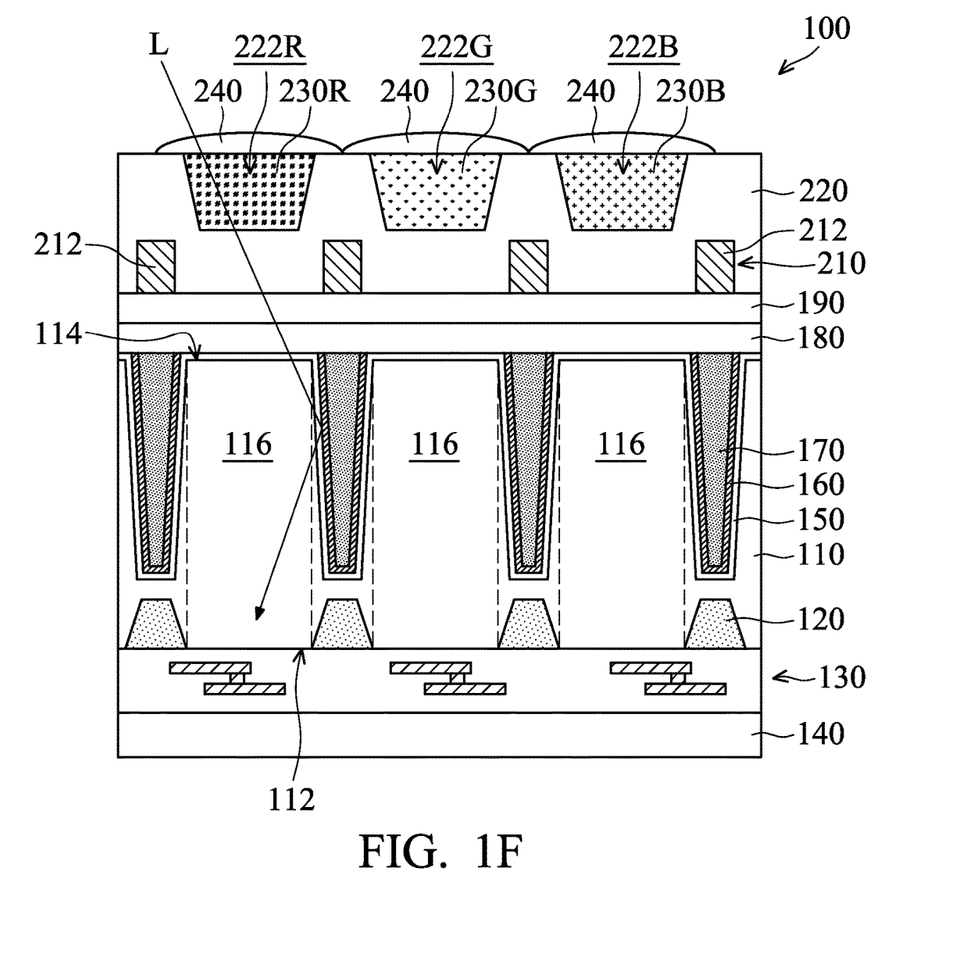

Thereafter, as shown in FIG. 1F, an anti-reflection coating (ARC) layer 180 and a buffer layer 190 are sequentially formed over the back surface 114 of the semiconductor substrate 110, in accordance with some embodiments. The ARC layer 180 is used to reduce optical reflection from the back surface 114 of the semiconductor substrate 110 to ensure that most of an incident light enters the light-sensing regions 116 and is sensed.

The ARC layer 180 may be made of a high-k material, a dielectric material, other applicable materials, or a combination thereof. The high-k material may include hafnium oxide, tantalum pentoxide, zirconium dioxide, aluminum oxide, other suitable materials, or a combination thereof. The dielectric material includes, for example, silicon nitride, silicon oxynitride, other suitable materials, or a combination thereof.

The buffer layer 190 is used as a buffer between the ARC layer 180 and an overlying layer subsequently formed. The buffer layer 190 may be made of a dielectric material or other suitable materials. For example, the buffer layer 190 is made of silicon oxide, silicon nitride, silicon oxynitride, other applicable materials, or a combination thereof.

Thereafter, a reflective grid 210 is formed over the buffer layer 190, in accordance with some embodiments. The reflective grid 210 may include reflective elements 212. In some embodiments, the reflective elements 212 are aligned with the reflective layer 160 in the trenches 118. Each of the reflective elements 212 is used to prevent the incident light from entering a neighboring pixel. The crosstalk problems between pixels are thus prevented or reduced.

In some embodiments, the reflective grid 210 is made of a reflective material such as a metal material. The reflective grid 210 may be made of aluminum, silver, copper, titanium, platinum, tungsten, tantalum, tantalum nitride, other suitable materials, or a combination thereof. In some embodiments, the reflective grid 210 is formed over the buffer layer 190 using a suitable process. The suitable process includes, for example, a PVD process, an electroplating process, a CVD process, other applicable processes, or a combination thereof.

Afterwards, a dielectric layer 220 is formed over the buffer layer 190 to cover the reflective grid 210, in accordance with some embodiments. The dielectric layer 220 may be made of silicon oxide, silicon nitride, silicon oxynitride, or other suitable materials. The dielectric layer 220 is formed by a CVD process or another suitable process. The dielectric layer 220 has multiple recesses 222R, 222G, and 222B.

Thereafter, visible light filters (such as color filters 230R, 230G, and 230B) are formed in the recesses 222R, 222G, and 222B, respectively. In some embodiments, the visible light filters may be used to filter through visible light. The color filters 230R, 230G, and 230B may be used to filter through a red wavelength band, a green wavelength band, and a blue wavelength band, respectively.

Afterwards, lenses 240 are respectively formed over the color filters 230R, 230G, and 230B, in accordance with some embodiments. The lenses 240 are used to direct or focus the incident light. The lenses 240 may include a microlens array. The lenses 240 may be made of a high transmittance material. For example, the high transmittance material includes transparent polymer material (such as polymethylmethacrylate, PMMA), transparent ceramic material (such as glass), other applicable materials, or a combination thereof. In this step, an image sensor device 100 is substantially formed, in accordance with some embodiments.

As shown in FIG. 1F, incident light L passing through the light-sensing region 116 under the color filter 230R and arriving at the reflective layer 160 may be reflected by the reflective layer 160 and thus travel back into the light-sensing region 116 under the color filter 230R. Therefore, the reflective layer 160 may reduce optical crosstalk and improve quantum efficiency.

In accordance with some embodiments, image sensor devices and methods for forming the same are provided. The methods (for forming the image sensor devices) form a reflective layer in trenches between light-sensing regions in a semiconductor substrate. The reflective layer may reflect incident light arriving at the reflective layer to prevent the incident light from traveling between the different light-sensing regions. The reflected incident light may be directed back into the light-sensing region by the reflective layer. Therefore, optical crosstalk is reduced, and quantum efficiency of the image sensor devices is improved.

In accordance with some embodiments, an image sensor device is provided. The image sensor device includes a semiconductor substrate. The semiconductor substrate has a front surface, a back surface opposite to the front surface, a light-sensing region close to the front surface, and a trench adjacent to the light-sensing region. The image sensor device includes a reflective layer positioned on an inner wall of the trench. The reflective layer has a light reflectivity ranging from about 70% to about 100%.

In accordance with some embodiments, an image sensor device is provided. The image sensor device includes a semiconductor substrate. The semiconductor substrate has a front surface, a back surface opposite to the front surface, a light-sensing region close to the front surface, and a trench adjacent to the light-sensing region. The image sensor device includes an insulating layer positioned on an inner wall and a bottom surface of the trench. The image sensor device includes a reflective layer conformally positioned over the insulating layer. The reflective layer has a light reflectivity ranging from about 70% to about 100%.

In accordance with some embodiments, a method for forming an image sensor device is provided. The method includes providing a semiconductor substrate. The semiconductor substrate has a front surface, a back surface opposite to the front surface, a light-sensing region close to the front surface, and a trench adjacent to the light-sensing region. The method includes forming a reflective layer on an inner wall of the trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor device, comprising:
   a semiconductor substrate comprising a front surface, a back surface opposite to the front surface, a first light-sensing region close to the front surface, a second light-sensing region close to the front surface, and a first trench between the first light-sensing region and the second light-sensing region;
   a reflective layer positioned on a first inner wall and a second inner wall of the first trench and on a bottom surface of the first trench that is between the first inner wall and the second inner wall, wherein the reflective layer has a light reflectivity ranging from about 70% to about 100%, the first inner wall is opposite to the second inner wall, the second inner wall is between the first inner wall and the first light-sensing region, the reflective layer has a first portion covering the first inner wall and a second portion covering the second inner wall, the first portion and the second portion extend to a first portion and a second portion of an opening edge of the first trench respectively, the first portion and the second portion of the opening edge of the first trench are adjacent to the first inner wall and the second inner wall respectively, the reflective layer has a bottom portion on the bottom surface of the first trench, and the reflective layer is electrically isolated from the first light-sensing region of the semiconductor substrate;

an insulating layer positioned between the reflective layer and the semiconductor substrate; and an isolation structure in the semiconductor substrate and adjacent to the front surface, wherein the reflective layer and the entirety of the isolation structure are between the first light-sensing region and the second light-sensing region, the reflective layer is over the isolation structure, and the isolation structure and the insulating layer are separated from each other by the semiconductor substrate.

2. The image sensor device as claimed in claim 1, further comprising:

an insulating structure filled in the first trench.

3. The image sensor device as claimed in claim 2, wherein the reflective layer is positioned between the insulating layer and the insulating structure.

4. The image sensor device as claimed in claim 1, wherein the reflective layer does not cover the back surface, and the isolation structure does not cover the front surface.

5. The image sensor device as claimed in claim 1, wherein the first trench extends from the back surface.

6. The image sensor device as claimed in claim 1, wherein the reflective layer comprises a metal material or an alloy material.

7. The image sensor device as claimed in claim 1, wherein the semiconductor substrate further comprises a second trench adjacent to the first light-sensing region, the first trench and the second trench are positioned on two opposite sides of the first light-sensing region, the insulating layer extends from the first trench into the second trench, and the reflective layer is further positioned in the second trench and on the insulating layer.

8. The image sensor device as claimed in claim 1, wherein the isolation structure is made of silicon oxide, silicon nitride, silicon oxynitride, fluoride-doped silicate glass, or a combination thereof.

9. An image sensor device, comprising:

a semiconductor substrate comprising a front surface, a back surface opposite to the front surface, a first light-sensing region close to the front surface, a second light-sensing region close to the front surface, and a trench between the first light-sensing region and the second light-sensing region;

an insulating layer positioned on a first inner wall, a second inner wall, and a bottom surface of the trench that is between the first inner wall and the second inner wall, wherein the first inner wall is opposite to the second inner wall, and the second inner wall is between the first inner wall and the first light-sensing region;

a reflective layer conformally positioned over the insulating layer, wherein the reflective layer has a light reflectivity ranging from about 70% to about 100%, the reflective layer has a first portion covering the first inner wall and a second portion covering the second inner wall, the first portion and the second portion of the reflective layer extend to a first portion and a second portion of an opening edge of the trench respectively, the first portion and the second portion of the opening edge of the trench are adjacent to the first inner wall and the second inner wall respectively, the reflective layer has a bottom portion on the bottom surface of the trench, and the reflective layer is electrically isolated from the first light-sensing region of the semiconductor substrate; and an isolation structure in the semiconductor substrate and adjacent to the front surface, wherein the reflective layer and the entirety of isolation structure are between the first light-sensing region and the second light-sensing region, the reflective layer is over the isolation structure, and the isolation structure and the insulating layer are separated from each other by the semiconductor substrate.

10. The image sensor device as claimed in claim 9, further comprising:

an insulating structure filled in the trench.

11. The image sensor device as claimed in claim 10, wherein the reflective layer surrounds the insulating structure.

12. The image sensor device as claimed in claim 10, wherein the reflective layer is positioned between the insulating structure and the insulating layer.

13. The image sensor device as claimed in claim 9, wherein the reflective layer does not cover the back surface, and the isolation structure does not cover the front surface.

14. The image sensor device as claimed in claim 9, wherein the insulating layer and the semiconductor substrate separate the reflective layer from the isolation structure.

15. The image sensor device as claimed in claim 9, wherein the isolation structure is made of silicon oxide, silicon nitride, silicon oxynitride, fluoride-doped silicate glass, or a combination thereof.

16. A method for forming an image sensor device, comprising:

providing a semiconductor substrate comprising a front surface and a back surface opposite to the front surface;

forming an isolation structure in the semiconductor substrate and adjacent to the front surface;

forming a first light-sensing region, a second light-sensing region, and a trench in the semiconductor substrate, wherein the first light-sensing region and the second light-sensing region are close to the front surface, and the trench and the entirety of the isolation structure are between the first light-sensing region and the second light-sensing region;

forming an insulating layer in the trench, wherein the isolation structure and the insulating layer are separated from each other by the semiconductor substrate; and forming a reflective layer on a first inner wall and a second inner wall of the trench and on a bottom surface of the trench that is between the first inner wall and the second inner wall, the first inner wall is opposite to the second inner wall, the second inner wall is between the first inner wall and the first light-sensing region, the reflective layer has a first portion covering the first inner wall and a second portion covering the second inner wall, the first portion and the second portion of the reflective layer extend to a first portion and a second portion of an opening edge of the trench respectively, the first portion and the second portion of the opening edge of the trench are adjacent to the first inner wall and the second inner wall respectively, and the reflective layer has a bottom portion on the bottom surface of the trench, the reflective layer is formed over the insulating layer, the reflective layer is electrically isolated from the first light-sensing region of the semiconductor substrate, and the reflective layer is over the isolation structure and between the first light-sensing region and the second light-sensing region.

17. The method for forming an image sensor device as claimed in claim 16, wherein the forming of the reflective layer comprises:
conformally forming the reflective layer on the insulating layer.

18. The method for forming an image sensor device as claimed in claim 16, further comprising:
after the forming of the reflective layer, filling an insulating structure in the trench.

19. The method for forming an image sensor device as claimed in claim 16, wherein the forming of the reflective layer comprises:
forming a metal layer over the first inner wall, the second inner wall, and the bottom surface of the trench.

20. The image sensor device as claimed in claim 16, wherein the isolation structure is made of silicon oxide, silicon nitride, silicon oxynitride, fluoride-doped silicate glass, or a combination thereof.

* * * * *